United States Patent [19]

Bahl

[11] Patent Number: 4,679,010

[45] Date of Patent: Jul. 7, 1987

[54] MICROWAVE CIRCULATOR COMPRISING A PLURALITY OF DIRECTIONAL COUPLERS CONNECTED TOGETHER BY ISOLATION AMPLIFIERS

[75] Inventor: Inder J. Bahl, Roanoke, Va.

[73] Assignee: ITT Gallium Arsenide Technology Center, a division of ITT Corporation, Roanoke, Va.

[21] Appl. No.: 811,923

[22] Filed: Dec. 20, 1985

[51] Int. Cl.⁴ ................... H03H 7/52; H03H 11/02
[52] U.S. Cl. ................................. 333/109; 333/1.1; 330/277
[58] Field of Search ............... 330/277, 306; 333/1.1, 333/109, 1, 24 R, 24.2, 32, 112, 113–117, 120

[56] References Cited

U.S. PATENT DOCUMENTS

| | | | |
|---|---|---|---|
| 3,017,577 | 1/1962 | Kostelnick | 333/24.2 X |
| 3,423,688 | 1/1969 | Seidel | 333/117 X |
| 3,860,893 | 1/1975 | Ropars et al. | 333/1.1 |
| 4,390,851 | 6/1983 | Higgins et al. | 330/277 |
| 4,525,678 | 6/1985 | Lehmann et al. | 330/277 |

FOREIGN PATENT DOCUMENTS

| | | | |
|---|---|---|---|
| 2565047 | 11/1985 | France | 330/277 |
| 115044 | 9/1979 | Japan | 333/1.1 |
| 1588518 | 4/1981 | United Kingdom | 333/109 |

Primary Examiner—Paul Gensler
Attorney, Agent, or Firm—Robert A. Walsh; Mary C. Werner

[57] ABSTRACT

A gallium arsenide isolator has a common gate FET for amplifying a microwave signal, the common gate FET being connected to a common drain FET for transmitting the microwave signal and for isolating the common gate FET from signals travelling in a direction opposite to the microwave signal. One or more L-C networks are connected at one end between the input and output of the isolator and at the other end to ground. The circulator includes three arms each having a gallium arsenide isolator. Each of the arms is coupled to another one of the arms by means of a four port coupler which permits transmission of a signal from one port to a second diagonally opposite port, the third port receiving a fixed fraction of the power and the fourth port receiving effectively no power.

3 Claims, 2 Drawing Figures

MICROWAVE CIRCULATOR COMPRISING A PLURALITY OF DIRECTIONAL COUPLERS CONNECTED TOGETHER BY ISOLATION AMPLIFIERS

BACKGROUND OF THE INVENTION

This invention relates to monolithic microwave integrated circuits and in particular to GaAs isolators and circulators for such systems.

In many microwave systems, nonreciprocal components such as isolators and circulators are needed for avoiding interaction between various ports of a system. In conventional microwave circuits and hybrid microwave integrated circuits, a ferrite material is used to form these components. These components can also be fabricated on a gallium arsenide (GaAs) substrate by using ferrite disks and permanent magnets. However, this technique results in excessively large size and weight and is not compatible with monolithic microwave integrated circuit (MMIC) technology.

OBJECTS OF THE INVENTION

It is therefore an object of the present invention to provide non-reciprocal components such as isolators and circulators for a monolithic microwave integrated circuit which are of small size and low weight.

It is an additional object of the present invention to provide such non-reciprocal components on a GaAs substrate.

It is still another object of the present invention to provide a monolithic gallium aresenide circuit capable of operating at higher frequency ranges than is possible with a gallium aresenide having a ferrite material used as an isolator or circulator.

SUMMARY OF THE INVENTION

These objects and other which will become apparent hereinafter are accomplished by the present invention which provides an isolator for microwave circuits including means for amplifying a microwave signal and means connected to the amplifying means for transmitting the microwave signal while isolating the first means from signals travelling in an opposite directon to the first microwave signal.

Another feature of the present invention is the provision of a circulator which includes three or more arms, each of the arms having at least one isolator and a coupler joining each of the arms, each coupler having at least four ports.

BRIEF DESCRIPTION OF THE DRAWINGS

The above-mentioned and other features and objects of the present invention will become more apparent by reference to the following description taken in conjunction with the accompanying drawings in which.

DETAILED DESCRIPTION OF THE PREFERRED EMBODIMENT

Figure 1:
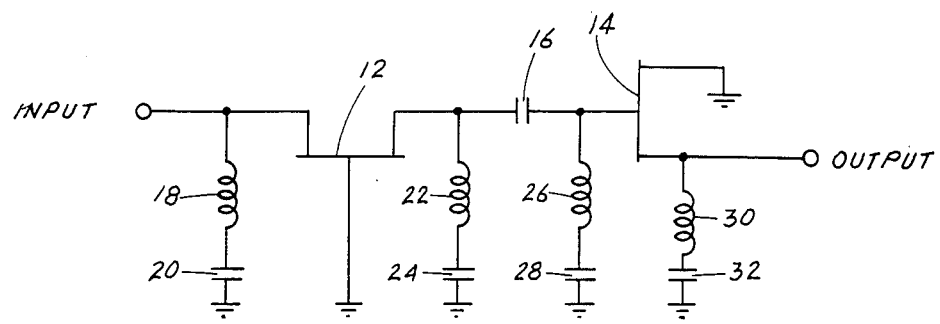
FIG. 1 is a schematic of an active isolator of this invention.

FIG. 1 illustrates a schematic diagram of an active isolator of the present invention. The active isolator is a two-port nonreciprocal network. In the forward direction, the signal is transmitted with insertion gain, while in the reverse direction there is no transmission. Any power entering from the output side is absorbed in the circuit. The isolator has a common gate FET at the input and a common drain FET at the output. The gate sizes of these FETs are optimized for a good match to 50 ohm input and output. This particular configuration of FETs allows for easy adaptation of the isolator input and output to a desired 50 ohm level for microwave circuits in general.

As shown in FIG. 1 the isolator circuit contains a number of series L-C circuits (18, 20; 22, 24; 26, 28; and 30, 32) connected between the transmission line and ground which function to impedance balance the circuit throughout its length. The L-C circuits tend to drain off low frequency signals or noise which might be coupled onto the line. The microwave signal enters the circuit at the input terminal and passes through common gate FET 12 which functions as an amplifier. It then proceeds through capacitor 16 which is sized so as to pass the high frequency signal and then proceeds to common drain FET 14. The capacitor 16 also blocks DC voltage from passing from FET 12 to FET 14. The capacitor 16 is also sized so as to block low frequency signals from passing through the circuit in either direction.

An important feature of the FET 14 is that the impedance presented between the source and gate terminals for a reflected signal entering the output terminal in the reverse direction is so high that such a signal is attenuated by 25 dB. Thus, the circuit presents excellent isolation capability against standing waves which might be created by impedance mismatch on other parts of the transmission line.

Both narrowband and broadband isolators with the configuration shown in FIG. 1 have been designed with 0, 3 and 6 dB gain. The circuits are matched at the input and output to 50 ohms with a voltage standing wave ratio (VSWR) less than 1.2. As stated previously the isolator blocks reflection at the output end.

Figure 2:
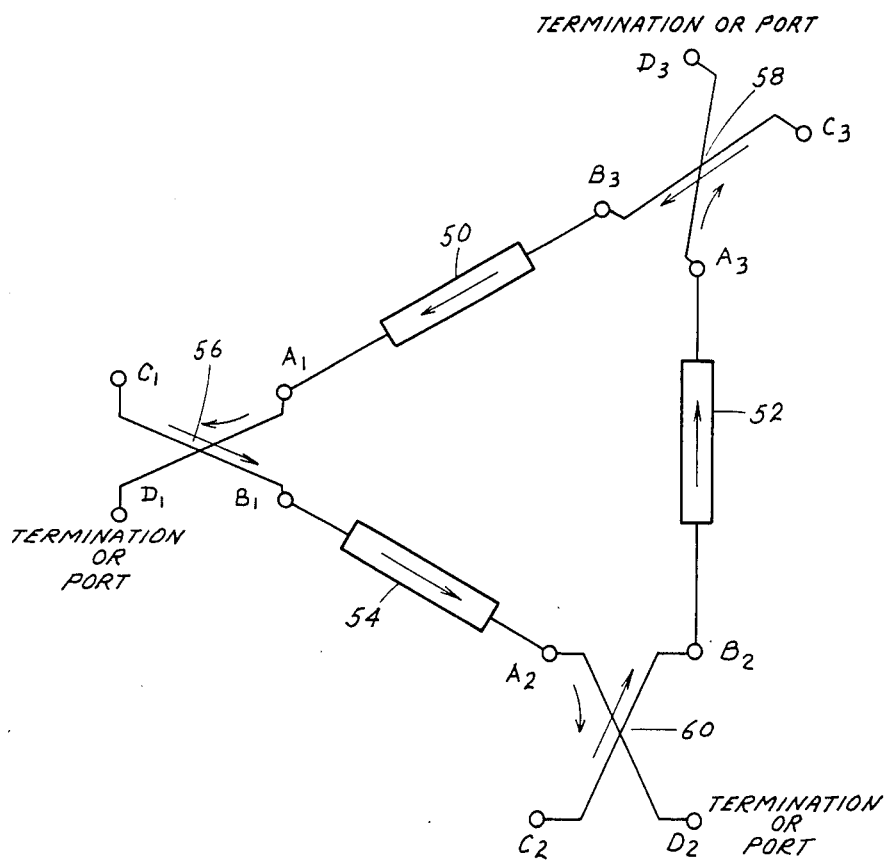
FIG. 2 is a schematic of an active circulator which includes the isolator of FIG. 1.

Reference will now be made to FIG. 2 which illustrates an active circulator which includes three isolators 50, 52 and 54 made in accordance with this invention and three 3dB couplers 56, 58 and 60. Each of the couplers 56, 58 and 60 is a four-port network commonly used for sampling a known fraction of power flowing in a particular direction. Each of the ports is labeled A, B, C and D. When a wave travels from any input port to a diagonally opposite second port, a fixed fraction of this power appears as a third port and there is effectively no power at the fourth port. The particular coupler used in this embodiment is a 3 dB, hybrid, broadband Lange coupler with 26 dB isolation.

When port $C_1$ is excited with a signal of unit amplitude, a $-3$ dB signal appears at port $A_1$, and another $-3$ dB signal appears at port $B_1$. The port $B_1$ may be terminated or used as another port. Due to excellent isolation of the active isolator 50 which is better than 27 dB over the band, the signal at port $B_3$ is less than $-30$ dB and at port $C_3$ less than $-33$ dB. The signal between the ports $B_1$ and $A_2$ is amplified by 6 dB when it passes through the active isolator 54 and the signal at port $A_2$ appears to be 3 dB more than the signal entering at port $C_1$. Thus, signal levels reaching ports $C_2$, $D_2$ and $B_2$ are 0 dB, 0 dB and $-24$ dB, respectively, and the whole configuration works as a circulator with 0 dB insertion loss and $-33$ dB isolation between ports $C_2$ and $C_1$.

DC voltage is required for biasing active devices which are an integral part of isolators.

Because the ferrite material is eliminated by the isolator of this invention, an operating range of 2-20 GHz is now possible. Previous rates were in the range of 2-12 GHz.

While I have described above the principles of my invention in connection with specific apparatus, it is to be clearly understood that this description is made only by way of example and not as a limitation to the scope of my invention as set forth in the objects thereof and in the accompanying claims.

What is claimed is:

1. A circulator comprising at least three hybrid directional couplers, each of said hybrid directional couplers having four ports, one of said ports receiving a microwave signal which is transmitted to a diagonally opposite second port, the third port receiving a fixed fraction of the power and the fourth port receiving effectually no power, at least three isolator means, each of said isolator means connecting said second port of one of said at least three hybrid directional couplers to said third port of another of said at least three hybrid directional couplers so that each directional coupler is connected to another via an isolator means to form a circulator having at least three arms, each of said isolator means being configured to transmit a microwave signal from said second port of one of said hybrid directional couplers to said third port of said another of said hybrid directional couplers and imposing a substantial insertion loss in any reflected signals transmitting in a direction opposite thereto.

2. The circulator according claim 1 wherein each of said isolator means comprises:

means for amplifying a microwave signal; and means connected to said amplifying means for transmitting said microwave signal while isolating said amplifying means from signals travelling in a direction opposite to said microwave signal to be transmitted.

3. The circulator according to claim 1 wherein each of said isolator means comprises:

means for amplifying a microwave signal, said means for amplifying taking the form of a common gate FET;

means connected to said amplifying means for transmitting said microwave signal while isolating said amplifying means from signals travelling in a direction opposite to said microwave signal to be transmitted, said means for transmitting taking the form of a common drain FET exhibiting substantial insertion loss for reflected signals travelling in said direction opposite to said microwave signal to be transmitted;

a capacitor interposed in a signal path between said means for amplifying and said means for transmitting, said capacitor being sized to pass high frequency signals to said common drain FET and block low frequency signals in either direction in said signal path; and a plurality of series L-C circuits, each of said plurality of series L-C circuits being connected intermediate a reference point and selected portions of one of said means for amplifying and said means for transmitting to drain off low frequency signals and noise.

* * * * *